United States Patent
Fujisawa

(10) Patent No.: US 7,826,305 B2
(45) Date of Patent: Nov. 2, 2010

(54) LATENCY COUNTER, SEMICONDUCTOR MEMORY DEVICE INCLUDING THE SAME, AND DATA PROCESSING SYSTEM

(75) Inventor: Hiroki Fujisawa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 204 days.

(21) Appl. No.: 12/216,675

(22) Filed: Jul. 9, 2008

(65) Prior Publication Data

US 2009/0016146 A1 Jan. 15, 2009

(30) Foreign Application Priority Data

Jul. 10, 2007 (JP) .............................. 2007-181357

(51) Int. Cl.
*G11C 8/00* (2006.01)
(52) U.S. Cl. .............................. 365/233.1; 365/233.11; 365/236
(58) Field of Classification Search .............. 365/233.1, 365/236, 230.06, 230.08, 233.11
See application file for complete search history.

(56) References Cited

U.S. PATENT DOCUMENTS

| | | | |
|---|---|---|---|
| 5,999,458 A * | 12/1999 | Nishimura et al. | 365/189.05 |
| 7,345,950 B2 * | 3/2008 | Fujisawa et al. | 365/233.12 |
| 2006/0250883 A1 * | 11/2006 | Szczypinski | 365/233 |
| 2008/0043566 A1 * | 2/2008 | Fujisawa | 365/233.1 |
| 2008/0192563 A1 * | 8/2008 | Cho | 365/233.17 |

OTHER PUBLICATIONS

Song Ho Young., et al., "A 1.2Gb/s/pin Double Data Rate SDRAM with On-Die-Termination", ISSCC 2003/Session 17/SRAM and DRAM/PAPER 17.8, IEEE, 2003, p. 314.

* cited by examiner

*Primary Examiner*—Richard Elms
*Assistant Examiner*—Hien N Nguyen
(74) *Attorney, Agent, or Firm*—McGinn IP Law Group, PLLC

(57) ABSTRACT

A latency counter includes: a frequency-dividing circuit that generates a plurality of divided clocks LCLKE and LCLKO of which the phases differ each other based on an internal clock LCLK; and frequency-divided counter circuits each of which counts a latency of an internal command based on the corresponding divided clocks LCLKE and LCLKO. Thus, the counting of the latency is performed based not on the internal clock LCLK itself but on the divided clocks LCLKE and LCLKO obtained by frequency-dividing the internal clock LCLK. Thus, even when a frequency of the internal clock LCLK is high, an operation margin can be sufficiently secured.

23 Claims, 13 Drawing Sheets

LATENCY COUNTER, SEMICONDUCTOR MEMORY DEVICE INCLUDING THE SAME, AND DATA PROCESSING SYSTEM

TECHNICAL FIELD

The present invention relates to a latency counter, and more particularly relates to a latency counter that counts a latency of an internal command within a synchronous memory device. The present invention also relates to a semiconductor memory device including the latency counter, and a data processing system including the semiconductor memory device.

BACKGROUND OF THE INVENTION

A synchronous memory represented by a synchronous DRAM (Synchronous Dynamic Random Access Memory) is widely used for a main memory or the like of a personal computer. Because the synchronous memory can input and output data in synchronism with a clock signal supplied from a memory controller, when a higher-speed clock is used, a data transfer rate can be increased.

However, so long as a DRAM core performs an analog operation also in the synchronous DRAM, a considerably weak charge needs to be amplified based on a sense operation. Accordingly, it is not possible to shorten a time from issuing a read command until outputting first data. After a lapse of a predetermined delay time since issuance of the read command, the first data is outputted in synchronism with an external clock.

This delay time is generally called a "CAS latency" and is set to an integral multiple of a clock cycle. For example, when the CAS latency is 5 (CL=5), after fetching the read command in synchronism with the external clock, the first data is outputted in synchronism with the external clock after five cycles. That is, the first data is outputted after a lapse of the five clock cycles. A counter that counts such a latency is called a "latency counter".

For the latency counter, there has been known a circuit described in "A 1.2 Gb/s/pin Double Data Rate SDRAM with On-Die-Termination", Ho Young Song and 15 others, ISSCC 2003/SESSION 17/SRAM AND DRAM/PAPER 17.8, (United States), IEEE, 2003, p. 314. The latency counter described in the above non-patent document includes: a plurality of latch circuits that latch a read command; a switch that reads the read command from any one of the latch circuits; a first ring counter that selects the latch circuit to which the read command is latched by sequentially circulating the latch circuits; and a second ring counter that selects the latch circuit from which the read command is read by sequentially circulating the latch circuits. Thereby, the latched read command is outputted at a timing corresponding to a difference between a count value of the first ring counter and that of the second ring counter.

However, when different ring counters, i.e., one for input and the other for output, are used, if a frequency of a clock becomes high, synchronizing operations of the two ring counters become difficult. It sometimes becomes also impossible to simultaneously reset the two ring counters at a reset time. Accordingly, there arises a problem in that a count number of the latency is deviated, resulting in a malfunction.

To solve such a problem, the present inventor has proposed a method for sharing the ring counter between the uses, i.e., an input use and an output use. In this method, a value of the ring counter is used as a value for outputting, and that which is obtained by deviating the value of the ring counter by a predetermined value is used for inputting. Thereby, sharing the ring counter can be made.

However, as a result of further researches by the inventor, it was found that the ring counter itself probably malfunctioned in some cases. That is, the ring counter has a configuration such that out of the latch circuits connected in circulation, an active level (high level, for example) is latched to any one of the latch circuits, and the active level is shifted in circulation. However, at a time of entering a self-refresh mode or a power-down mode, a hazard is sometimes outputted to an internal clock depending on a certain timing. As a result, the ring counter can be in an unstable state.

When the ring counter is in an unstable state, an error occurs that the active level is latched to a plurality of latch circuits or a non-active level is latched to all the latch circuits. Such an error cannot be removed until when the entire memory is restarted. Accordingly, the latency counter cannot perform a normal operation any more without restarted.

SUMMARY OF THE INVENTION

The present invention has been achieved to solve such problems. Accordingly, an object of the present invention is to provide an improved latency counter and a semiconductor memory device including the same.

Another object of the present invention is to provide a latency counter capable of automatically restoring without restarting even when the count value jumps, and a semiconductor memory device including the same.

Still another object of the present invention is to provide a latency counter capable of sufficiently securing an operation margin even when a frequency of a clock is high, and a semiconductor memory device including the same.

Still another object of the present invention is to provide a data processing system using the semiconductor memory device.

A latency counter according to the present invention that counts a latency of an internal command in synchronism with an internal clock, the latency counter comprising:
a frequency-dividing circuit that generates a plurality of divided clocks of which phases differ each other based on the internal clock; and
a plurality of frequency-divided counter circuits each of which counts the latency of the internal command based on the corresponding divided clock.

Types of the counter included in the frequency-divided counter are not particularly limited, and the counter that outputs a count value in a binary format, e.g., a ripple counter, can be used. When the ripple counter is used, there is a problem in that a change is delayed more in higher-order bits at a time of incrementing or decrementing. However, in the present invention, a count operation is performed based not on the internal counter itself but on a frequency-divided clock obtained by dividing the internal counter. Thus, it is possible to sufficiently absorb a delay of high-order bits. In addition, the number of bits itself of the ripple counter can be reduced by the frequency division, and thus, as compared to a case that no frequency division is performed, a delay itself of a most significant bit can be decreased.

However, the count operation is performed based on the divided clock, and thus, basically, only the latency in which the frequency-dividing number is a multiple can be counted. For example, when the divided clock is a clock obtained by frequency-dividing the internal clock by 2, only an even-numbered latency can be counted. When this point is an application problem, a latency adding circuit capable of adding the latency of an internal command by at least one clock of the internal clock can be arranged. Thereby, setting to an arbitrary latency can be made.

Thus, according to the present invention, the counting of the latency is performed based not on the internal clock itself but on the divided clock obtained by frequency-dividing the internal clock. Thus, even when the frequency of the clock is high, it is possible to sufficiently secure an operation margin.

Further, when the counter that outputs the count value in a binary format is used, a possibility that the count value ends up with being an error is fundamentally eliminated. That is, when the ring counter is used, the active level needs to be latched only to one latch circuit, and in other states, an error occurs. However, the counter that outputs the count value in a binary format has no such limitation.

Accordingly, even when the count value jumps, there is no influence to the count operation of the latency at all. That is, the counter is automatically restored, and thus, it becomes possible to continue the normal operation without restarting.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
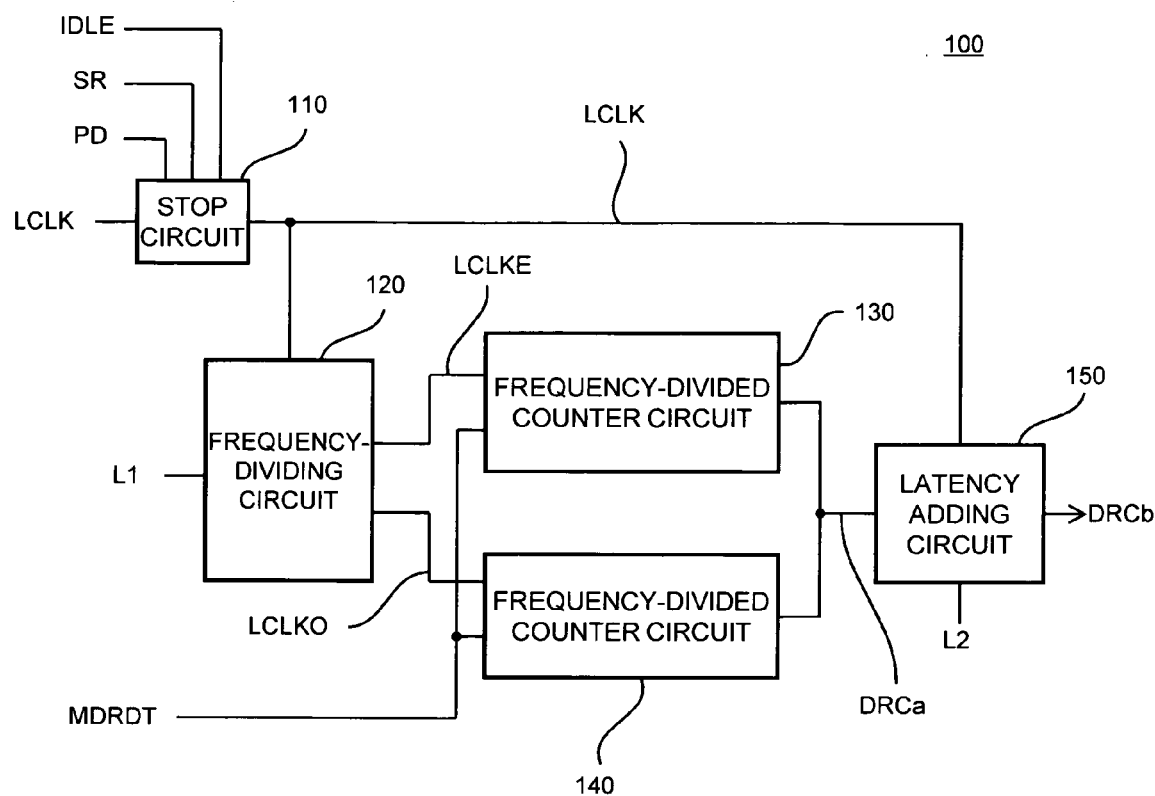
FIG. 1 is a circuit diagram of a latency counter according to a preferred embodiment of the present invention.

FIG. 1 is a circuit diagram of a latency counter 100 according to a preferred embodiment of the present invention.

The latency counter 100 according to the present embodiment is a counter (CL counter) that counts a CAS latency of a read command at the time of a read operation. However, a subject counter to which the present invention is applied is not limited thereto.

As shown in FIG. 1, the latency counter 100 includes: a frequency-dividing circuit 120 that generates divided clocks LCLKE and LCLKO based on an internal clock LCLK; frequency-divided counter circuits 130 and 140 that count a latency of an internal command MDRDT based on the respectively corresponding divided clocks LCLKE and LCLKO; and a latency adding circuit 150 capable of adding the latency of the internal command MDRDT by one clock cycle.

The internal clock LCLK is generated by a DLL (Delay Locked Loop) circuit not shown. At the time of a self-refresh mode or a power-down mode, to reduce a consumed power, the internal clock LCLK supplied to the latency counter 100 is cut off by a stop circuit 110.

Figure 2:
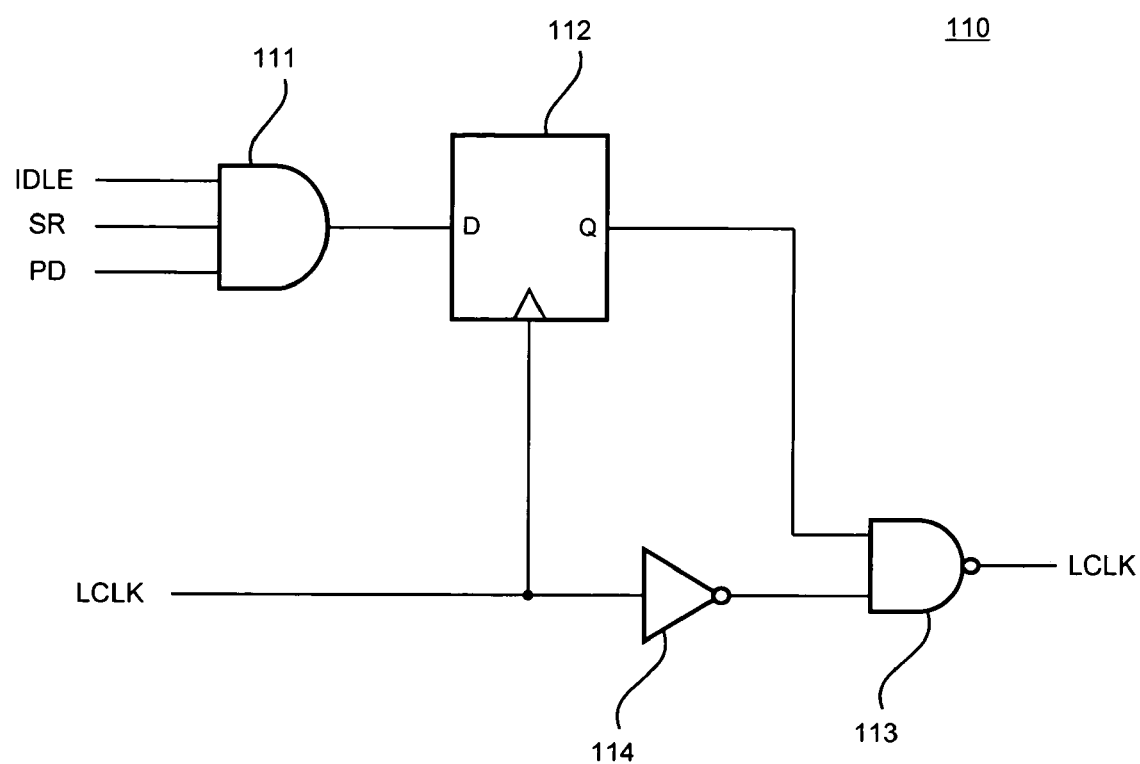
FIG. 2 is a circuit diagram of the stop circuit shown in FIG. 1.

FIG. 2 is a circuit diagram of the stop circuit 110.

As shown in FIG. 2, the stop circuit 110 includes: an AND circuit 111 that receives an idle signal IDLE, a self-refresh signal SR, and a power-down signal PD; and a latch circuit 112 that fetches output of the AND circuit 111 in synchronism with the internal clock LCLK. The idle signal IDLE, the self-refresh signal SR, and the power-down signal PD all maintain a high level at the time of a normal operation. Thus, at the time of a normal operation, also output of the latch circuit 112 is maintained at a high level.

The output of the latch circuit 112 is supplied to one input terminal of a NAND circuit 113. The other input terminal of the NAND circuit 113 is supplied with a signal obtained by inverting the internal clock LCLK by an inverter 114. Thus, at the time of a normal operation, the stop circuit 110 allows the internal clock LCLK to pass therethrough.

On the other hand, when at least one of the idle signal IDLE, the self-refresh signal SR, and the power-down signal PD becomes a low level, i.e., makes an entry into any one of an idle state, a self-refresh mode, and a power-down mode, the latch circuit 112 is fetched the low level. As a result, the internal clock LCLK is cut off by the NAND circuit 113.

The internal clock LCLK which passes through the stop circuit 110 is supplied to the frequency-dividing circuit 120 and the latency adding circuit 150 shown in FIG. 1.

Figure 3:
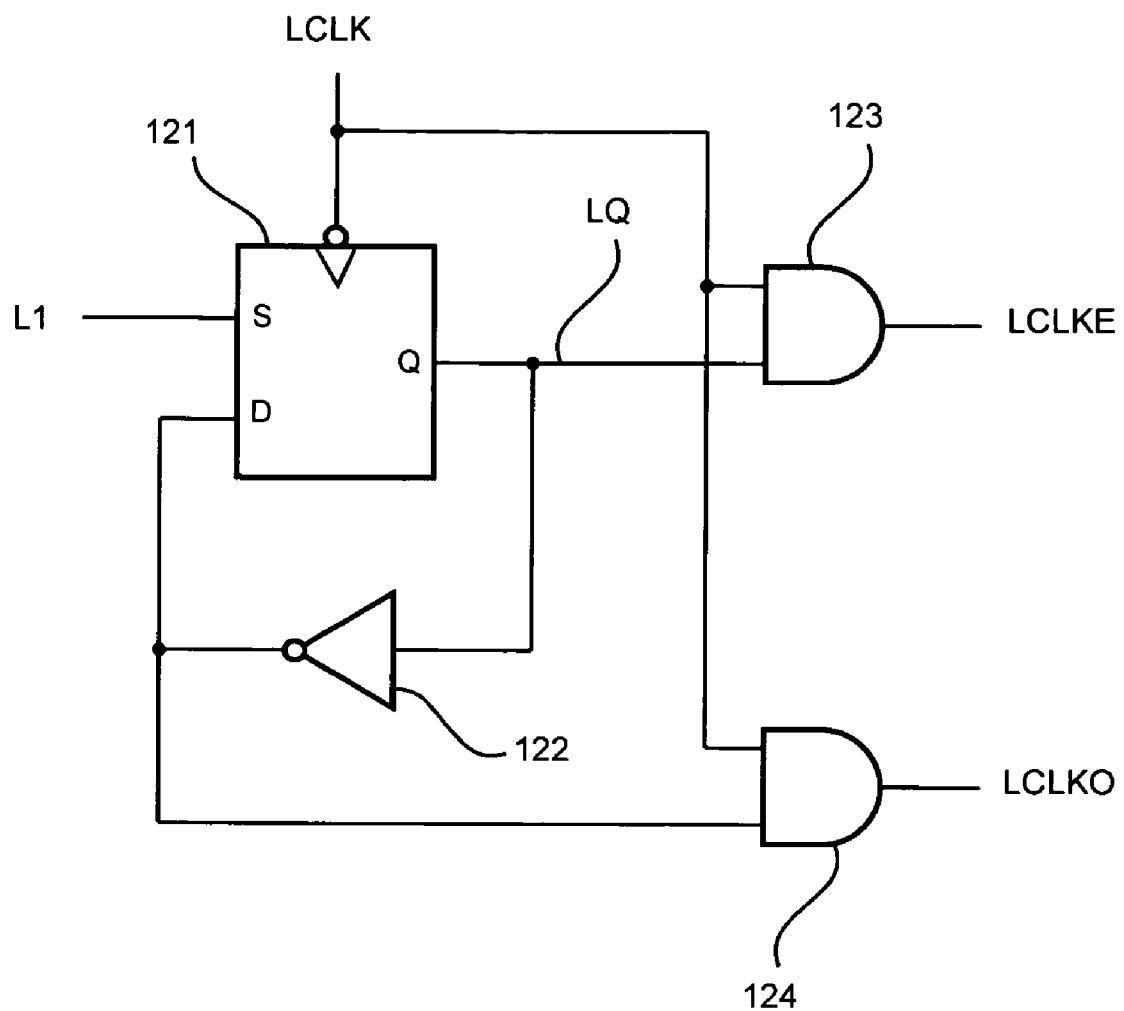
FIG. 3 is a circuit diagram of the frequency-dividing circuit shown in FIG. 1.
Figure 4:
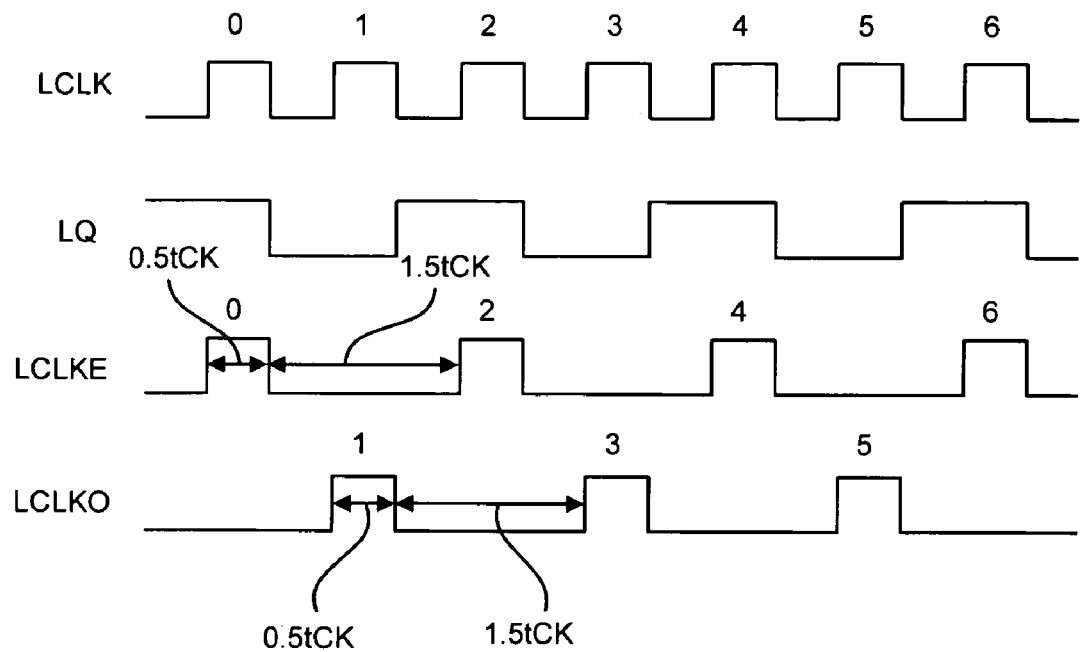
FIG. 4 is an operational waveform diagram of the frequency-dividing circuit.

FIG. 3 is a circuit diagram of the frequency-dividing circuit 120. FIG. 4 is an operational waveform diagram thereof.

As shown in FIG. 3, the frequency-dividing circuit 120 includes: a latch circuit 121 that performs a latch operation in synchronism with a falling edge of the internal clock LCLK; an inverter 122 that inverts a frequency-divided signal LQ outputted from an output terminal Q of the latch circuit and supplies the inverted signal to an input terminal D; an AND circuit 123 that performs AND operation of the internal clock LCLK and the frequency-divided signal LQ; and an AND circuit 124 that performs AND operation of the internal clock LCLK and an inverted signal of the frequency-divided signal LQ.

With such a circuit configuration, as shown in FIG. 4, the divided clock LCLKE or output of the AND circuit 123 becomes a waveform in sequence with an even-numbered internal clock LCLK, and the divided clock LCLKO or output of the AND circuit 124 becomes a waveform in sequence with an odd-numbered internal clock LCLK. Thus, in the divided clocks LCLKE and LCLKO, an active period (period during which a high level is attained) is 0.5 tCK and an inactive period (period during which a low level is attained) is 1.5 tCK.

Thus, the frequency-dividing circuit 120 divides the internal clock LCLK by 2 to generate the two divided clocks LCLKE and LCLKO of which the phases differ each other. The generated divided clocks LCLKE and LCLKO are supplied to the frequency-divided counter circuits 130 and 140, respectively, as shown in FIG. 1. Thus, the frequency-divided counter circuits 130 and 140 operate at a frequency half the internal clock LCLK.

In the latch circuit 121, a set terminal S is arranged, and the set terminal S is supplied with a control signal L1. The control signal L1 is activated when a value of the CAS latency is set to 1. Accordingly, when the CAS latency is set to 1, the frequency-dividing circuit 120 does not frequency-divide the internal clock LCLK but continuously outputs as the divided clock LCLKE. In this case, clocking of the divided clock LCLKO is stopped.

Figure 5:
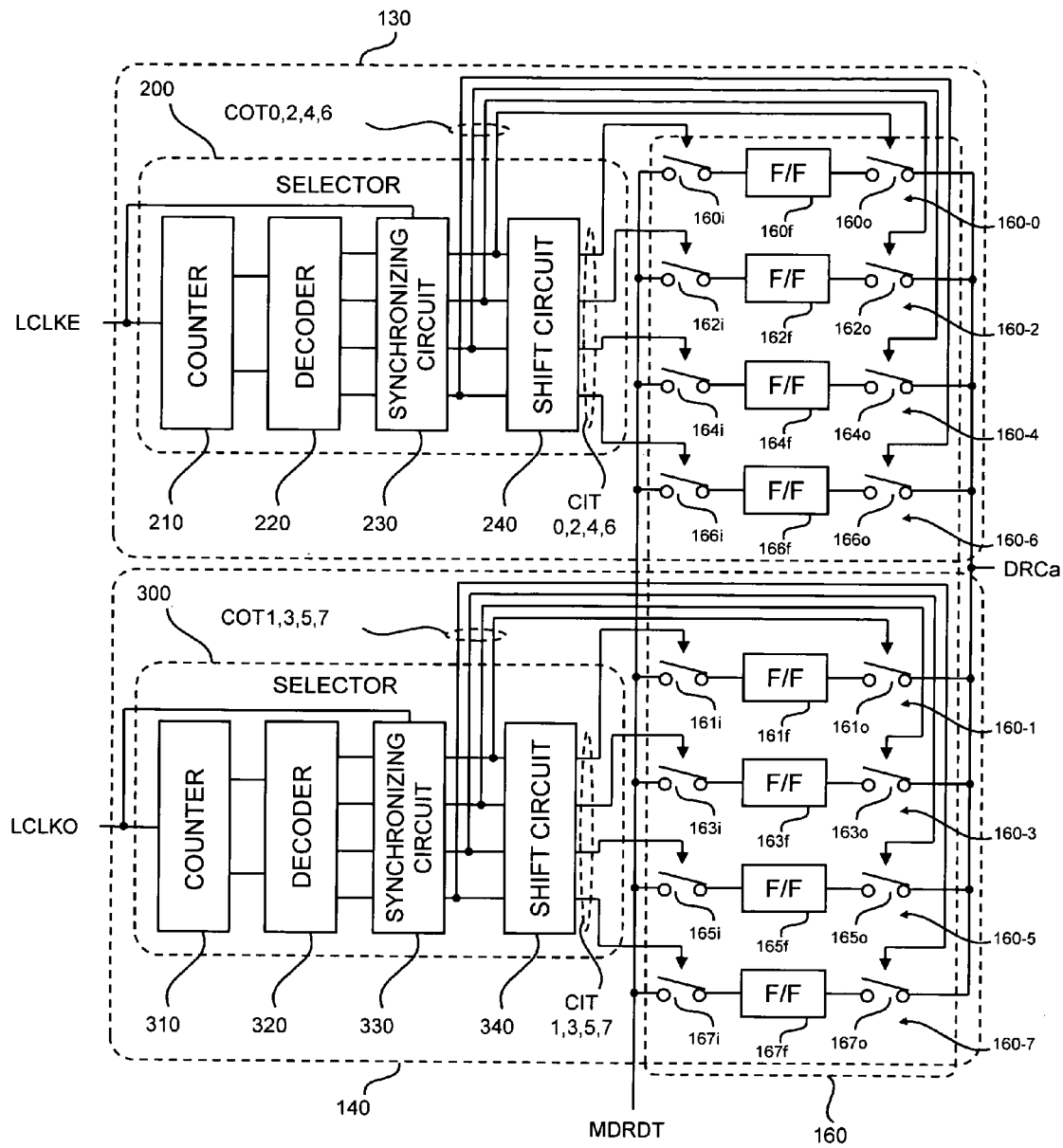
FIG. 5 is a circuit diagram showing configurations of the frequency-divided counter circuits shown in FIG. 1.

FIG. 5 is a circuit diagram showing configurations of the frequency-divided counter circuits 130 and 140.

As shown in FIG. 5, the frequency-divided counter circuits 130 and 140 have an identical circuit configuration to each other, and include: a point-shift FIFO circuit 160 formed of a plurality of latch circuits connected in parallel; and selectors 200 and 300 that control the operation of the point-shift FIFO circuit 160.

The selector 200 is configured by: a counter 210 that increments (or decrements) a count value in synchronism with the divided clock LCLKE; a decoder 220 that decodes the count value of the counter 210; a synchronizing circuit 230 that synchronizes outputs of the decoder 220 to the divided clock LCLKE; and a shift circuit 240 that shifts outputs of the synchronizing circuit 230. Similarly, the selector 300 is configured by: a counter 310 that increments (or decrements) a count value in synchronism with the divided clock LCLKO; a decoder 320 that decodes the count value of the counter 310; a synchronizing circuit 330 that synchronizes outputs of the decoder 320 to the divided clock LCLKO; and a shift circuit 340 that shifts outputs of the synchronizing circuit 330.

Figure 6:
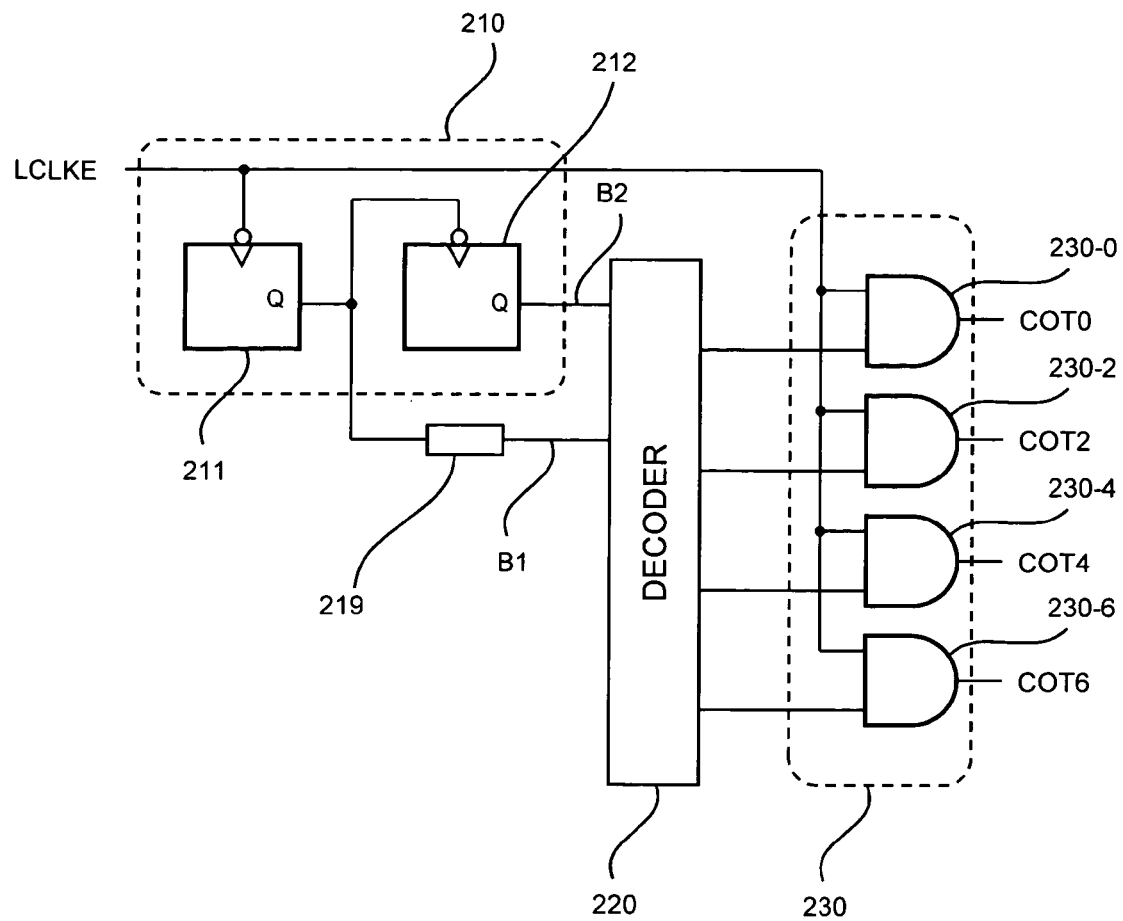
FIG. 6 is a circuit diagram of the counter, the decoder, and the synchronizing circuit included in the selector shown in FIG. 5.

FIG. 6 is a circuit diagram of the counter 210, the decoder 220, and the synchronizing circuit 230 included in the selector 200.

As shown in FIG. 6, the counter 210 is a 2-bit ripple counter having ripple-type flip-flops 211 and 212 connected in cascade. A clock terminal of the flip-flop 211 is supplied with the divided clock LCLKE. Accordingly, an output bit B1 of the flip-flop 211 shows a least significant bit of a binary signal. An output bit B2 of the flip-flop 212 is a most significant bit of the binary signal.

The output bits B1 and B2 of the flip-flops 211 and 212 are supplied to the decoder 220. However, the output bits B1 and B2 do not change at the same timing, but the change starts from a lower-order bit thereof. That is, the change of a higher-order bit is delayed. In the present embodiment, to eliminate a difference in such change timings, a delay circuit 219 is used. The delay circuit 219 has a delay amount which corresponds to one stage of the flip-flop. As shown in FIG. 6, the delay circuit 219 is connected between the flip-flop 211 and the decoder 220. Thus, the output bit B1 of the flip-flop 211 is applied a delay of one stage of the flip-flop, and thereafter, inputted to the decoder 220.

Thereby, the change timings of the bits B1 and B2 inputted to the decoder 220 substantially coincide with each other. The decoder 220 causes any one of four ($=2^2$) outputs to become active to a high level, based on the bits B1 and B2 in a binary format.

The synchronizing circuit 230 that receives the outputs of the decoder 220 is configured by four AND circuits 230-0, 230-2, 230-4, and 230-6 corresponding to the outputs of the decoder 220. One input terminals of the AND circuits 230-0, 230-2, 230-4, and 230-6 are supplied with the corresponding outputs of the decoder 220, respectively, and the other input terminals thereof are supplied commonly with the divided clock LCLKE. The outputs of the decoder 220 change with a delay with respect to the divided clock LCLKE because of presence of the counter 210 and the delay circuit 219. However, in the present embodiment, the counter 210 is the ripple counter of only 2 bits, and the delay amount is very small. Thus, a skew generated between the outputs of the decoder 220 and the divided clock LCLKE poses substantially no problem. The outputs of the synchronizing circuit 230 are used as output-gate control signals COT0, COT2, COT4, and COT6.

The output-gate control signals COT0, COT2, COT4, and COT6 are supplied to the shift circuit 240 shown in FIG. 5. The shift circuit 240 generates input-gate control signals CIT0, CIT2, CIT4, and CIT6 based on the output-gate control signals.

Figure 7:
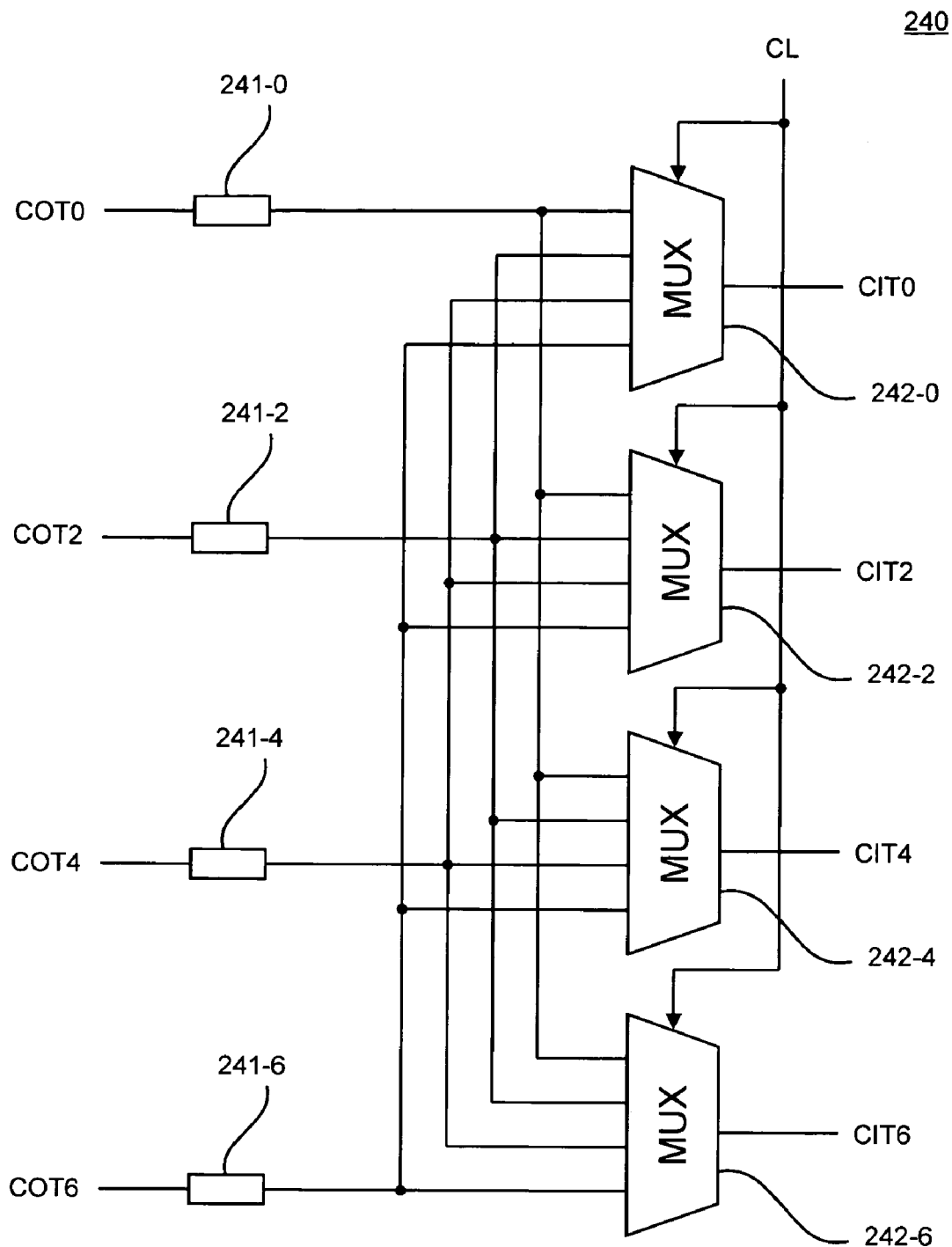
FIG. 7 is a circuit diagram of the shift circuit shown in FIG. 5.

FIG. 7 is a circuit diagram of the shift circuit 240.

As shown in FIG. 7, the shift circuit 240 includes: delay circuits 241-0, 241-2, 241-4, and 241-6 that delay the output-gate control signals COT0, COT2, COT4, and COT6, respectively; and multiplexers 242-0, 242-2, 242-4, and 242-6 that receive outputs of the delay circuits 241-0, 241-2, 241-4, and 241-6, respectively.

To synchronize the output-gate control signals COT0, COT2, COT4, and COT6 in synchronism with the divided clock LCLKE to an external clock (CK), the delay circuits 241-0, 241-2, 241-4, and 241-6 offset differences in timing. The multiplexers 242-0, 242-2, 242-4, and 242-6 cause the input-gate control signals CIT0, CIT2, CIT4, and CIT6, which are outputs of the multiplexers, to become active to a high level when predetermined one of the output-gate control signals COT0, COT2, COT4, and COT6 becomes a high level.

As to which input-gate control signals CIT0, CIT2, CIT4, and CIT6 are caused to become a high level when which output-gate control signals COT0, COT2, COT4, and COT6 become a high level totally differs depending on the multiplexers 242-0, 242-2, 242-4, and 242-6. A designation therefor is performed by a latency setting signal CL.

Figure 8A:
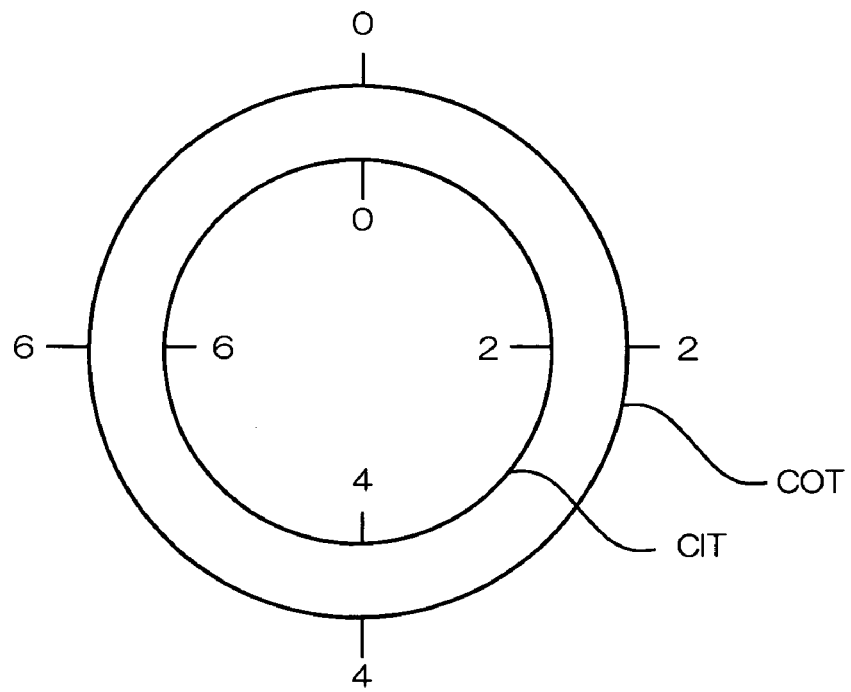
FIGS. 8A and 8B are schematic diagrams each for explaining a function of the shift circuit.
Figure 8B:
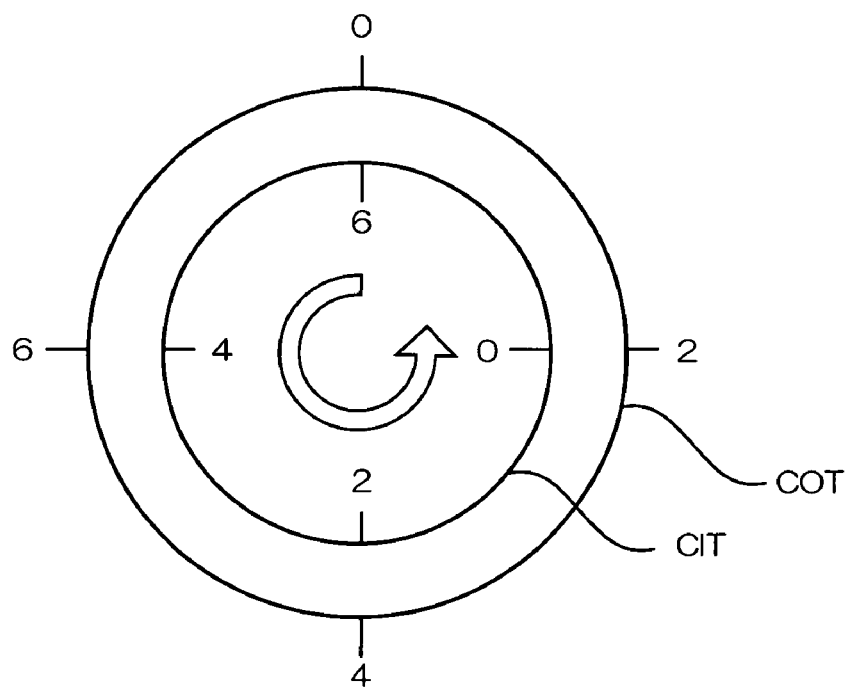

FIGS. 8A and 8B are schematic diagrams each for explaining a function of the shift circuit 240.

Outside rings COT shown in FIGS. 8A and 8B correspond to the output gate control signals and inside rings CIT correspond to the input gate control signals. In the drawings, it means that signals of which the scales attached to the rings COT and CIT coincide are the corresponding signals.

More specifically, FIG. 8A shows an example in which differences between the output-gate control signals COT0, COT2, COT4, and COT6, and the input-gate control signals CIT0, CIT2, CIT4, and CIT6 are set to "0". In this case, when the output-gate control signal COT0 becomes a high level, the corresponding input-gate control signal CIT0 becomes a high level, and when the output-gate control signal COT2 becomes a high level, the corresponding input-gate control signal CIT2 becomes a high level. That is, assuming that the output-gate control signals COTk (k is any one of 0, 2, 4, and 6) and the input-gate control signals CITj (j is any one of 0, 2, 4, and 6) correspond, a state of j=k is established.

On the other hand, FIG. 8B shows an example in which differences between the output-gate control signals COT0, COT2, COT4, and COT6, and the input-gate control signals CIT0, CIT2, CIT4, and CIT6 are set to "6". This is an image obtained by turning the inside ring CIT by three scales in the left. In this case, when the output-gate control signal COT0 becomes a high level, the corresponding input-gate control signal CIT6 becomes a high level, and when the output-gate control signal COT2 becomes a high level, the corresponding input-gate control signal CIT0 becomes a high level. That is, a state of j−k=6 or j−k=−2 is established.

The difference can be set to any one of 0, 2, 4, and 6. In a state that the difference is set, a correspondence relationship between the output-gate control signal and the input-gate control signal is fixed. Thus, the shift circuit shifts the output-gate control signals COT0, COT2, COT4, and COT6 to generate the input-gate control signals CIT0, CIT2, CIT4, and CIT6.

Such a difference is determined based on the CAS latency to be required. In the present embodiment, the divided clock LCLKE obtained by frequency-dividing the internal clock LCLK by 2 is used to perform the count operation, and thus, the CAS latency settable by the selector 200 is any one of 0, 2, 4, and 6. That is, the latency can only be set to an even number. The selector 300 included in the frequency-divided counter circuit 140 also has a circuit configuration similar to that of the selector 200, and generates output-gate control signals COT1, COT3, COT5, and COT7 and input gate control signals CIT1, CIT3, CIT5, and CIT7.

Thus, both the selectors 200 and 300 can only count the even-numbered latency. However, the selector 200 and the selector 300 so operate that the phases are deviated by only one clock of the internal clock LCLK, and thus, accepting a command is possible at any time. Accordingly, the internal command MDRDT synchronous with the even-numbered internal clock LCLK is counted by the selector 200, and the internal command MDRDT synchronous with the odd-numbered internal clock LCLK is counted by the selector 300.

Returning to FIG. 5, the point-shift FIFO circuit 160 is configured by eight latch circuits 160-0 to 160-7. The latch circuits 160-0 to 160-7 are each configured by: flip-flops 160*f* to 167*f*; input gates 160*i* to 167*i*; and output gates 160*o* to 167*o*, each of which gates are arranged to correspond to the flip-flops. The input gates 160*i* to 167*i* are each supplied with the input-gate control signals CIT0 to CIT7, which are outputs of the shift circuits 240 and 340. The output gates 160*o* to 167*o* are each supplied with the output-gate control signals COT0 to COT7, which are outputs of the synchronizing circuits 230 and 330.

Figure 9:
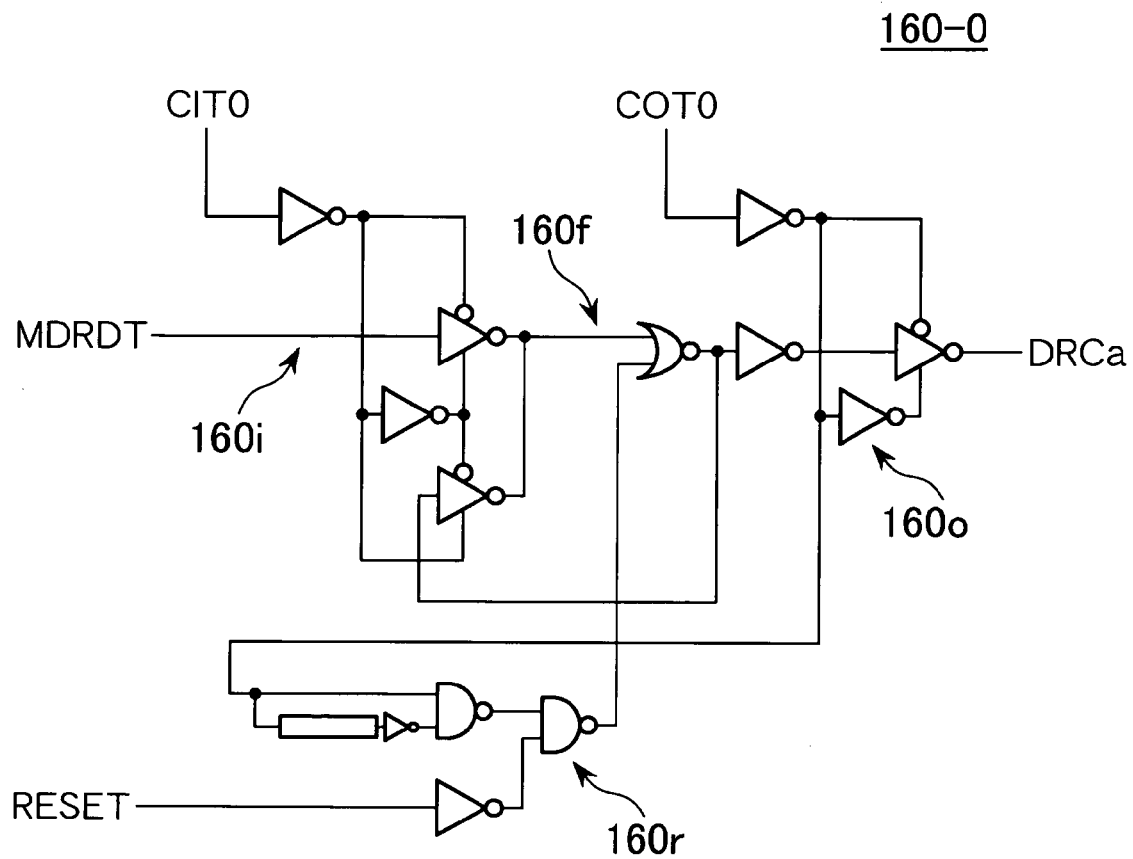
FIG. 9 is a circuit diagram of the latch circuit shown in FIG. 5.

FIG. 9 is a circuit diagram of the latch circuit 160-0.

As shown in FIG. 9, in the latch circuit 160-0, when the input-gate control signal CIT0 becomes a high level, the input gate 160*i* is opened, and the read command MDRDT is fetched. The fetched read command MDRDT is held by the flip-flop 160*f*. When the output-gate control signal COT0 becomes a high level, the output gate 160*o* is opened, and the fetched read command MDRDT is outputted.

The latch circuit 160-0 further includes a reset circuit 160*r*. The reset circuit 160*r* deletes the read command MDRDT held in the flip-flop 160*f* in response to a change of the output-gate control signal COT0 from a high level to a low level. When a reset signal RESET becomes a high level, the reset circuit 160*r* forcibly deletes the read command MDRDT held in the flip-flop 160*f*.

Circuit configurations of the other latch circuits 160-1 to 160-7 are also identical to that of the latch circuit 160-0 shown in FIG. 9 except that the input-gate control signals CIT1 to CIT7 and the output-gate control signals COT1 to COT7 are supplied. Outputs of the latch circuits 160-0 to 160-7 are commonly connected, and used as a read command DRCa.

Returning to FIG. 1, the latency counter 100 further includes the latency adding circuit 150 connected in a later stage of the point-shift FIFO circuit 160.

Figure 10:
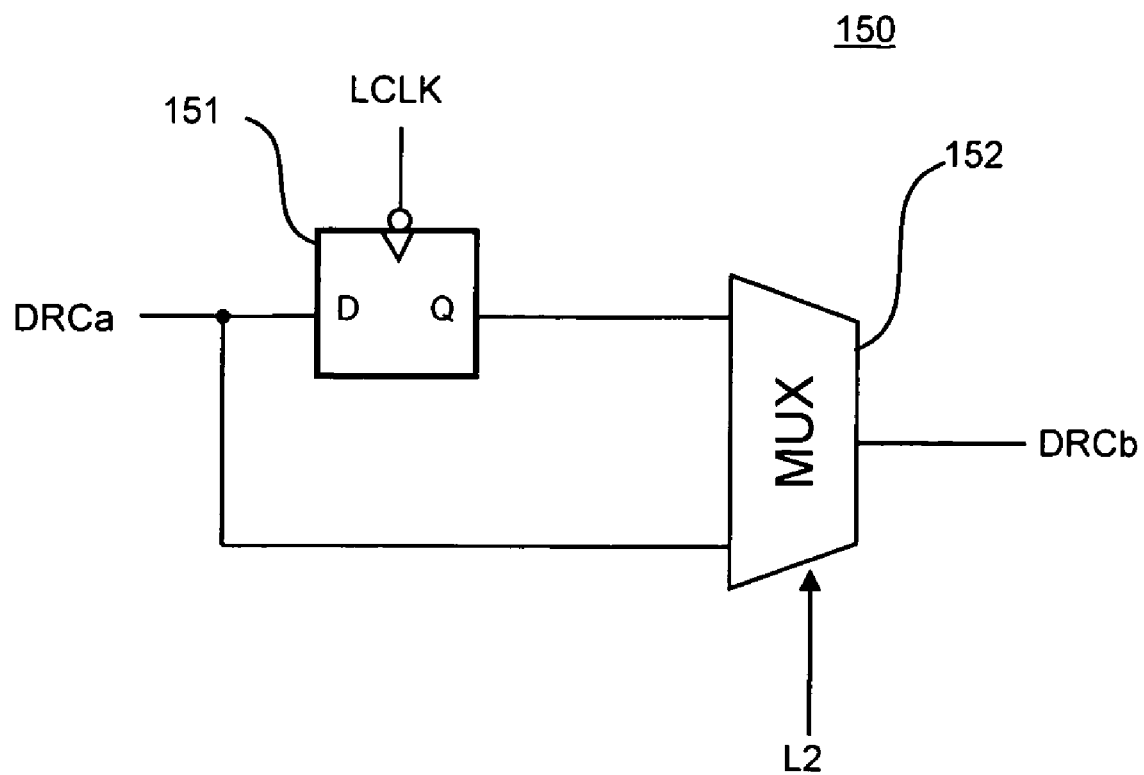
FIG. 10 is a circuit diagram of the latency adding circuit shown in FIG. 1.

FIG. 10 is a circuit diagram of the latency adding circuit 150.

As shown in FIG. 10, the latency adding circuit 150 includes: a latch circuit 151 that latches the read command DRCa in synchronism with the falling edge of the internal clock LCLK; and a multiplexer 152 that selects one of: the output of the latch circuit 151; and the read command DRCa.

The multiplexer 152 is supplied with a control signal L2. The control signal L2 is activated when the value of the CAS latency is set to an odd number. Accordingly, when the control signal L2 is inactive, the read command DRCa is continuously outputted as a read command DRCb. On the other hand, when the control signal L2 is active, the read command DRCa is latched to the latch circuit 151 once, and thereafter, outputted as the read command DRCb. Thereby, when the control signal L2 is activated, the CAS latency is added by one clock of the internal clock LCLK.

In the present invention, arranging the latency adding circuit 150 is not essential. However, as described above, the number of CAS latencies settable in the frequency-divided counter circuits 130 and 140 is limited to the even number. Thus, when the odd-numbered latencies are requested, the latency adding circuit 150 is arranged to realize the odd-numbered latencies.

The configuration of the latency counter 100 is as explained above. An operation of the latency counter 100 is explained next.

Figure 11:
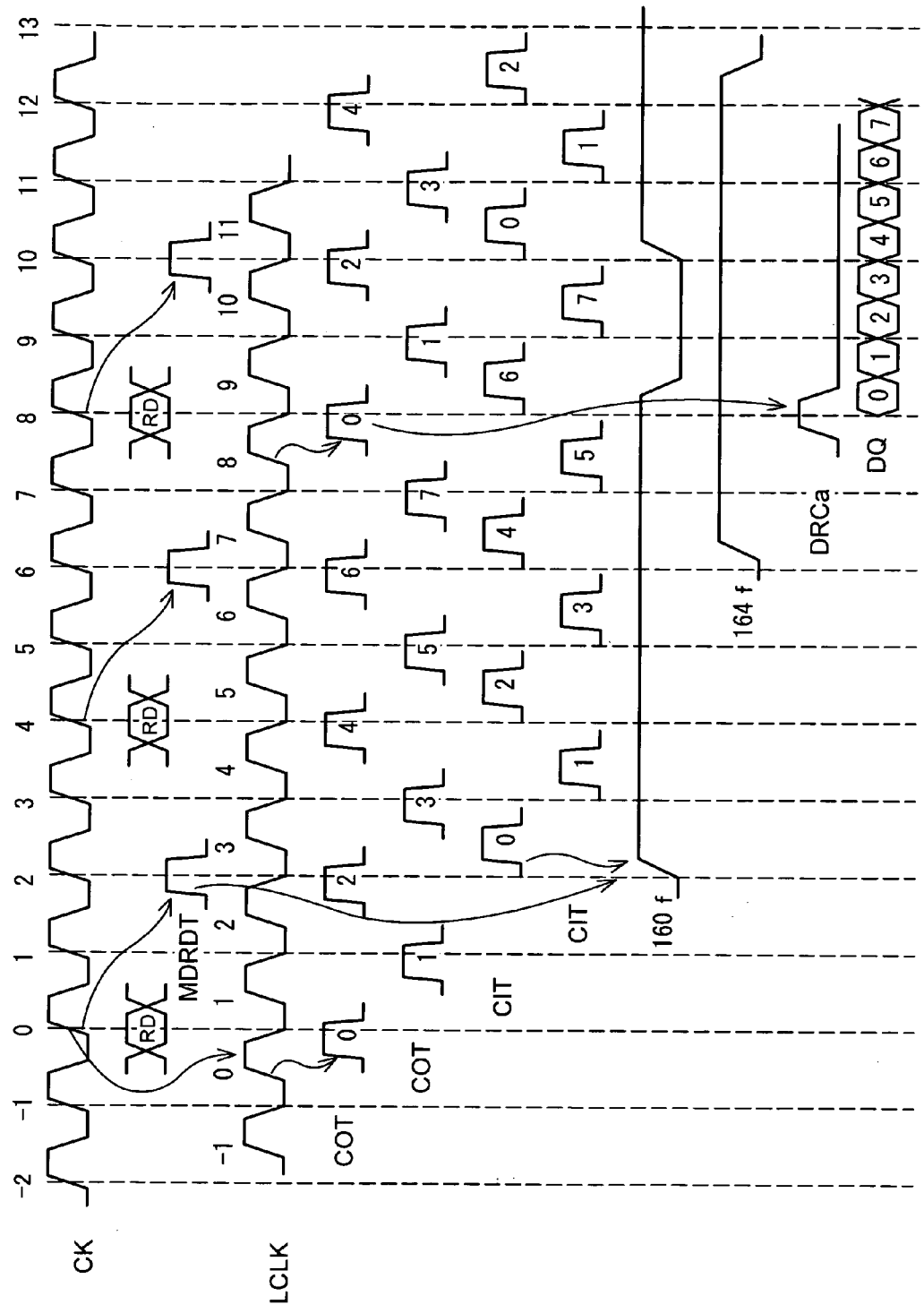
FIG. 11 is a timing chart for explaining the operation of the latency counter, and shows a case that the even-numbered latency is set.

FIG. 11 is a timing chart for explaining the operation of the latency counter 100, and shows a case that the even-numbered latency is set.

FIG. 11 shows an example in which a read command RD is issued in synchronism with an edge 0 of the external clock CK. As shown in FIG. 11, a predetermined time is required from issuance of the read command RD to the generation of the internal read command MDRDT. The read command MDRDT is held in any one of the eight flip-flops 160*f* to 167*f* configuring the point-shift FIFO circuit 160 based on the outputs of the shift circuits 240 and 340. In this example, there is shown a state where the input-gate control signal CIT0 is selected at a timing at which the first read command MDRDT is generated. Accordingly, in this case, the read command MDRDT is stored in the flip-flop 160*f*.

The read command MDRDT stored in the flip-flop 160*f* is held in the flip-flop 160*f* until the output-gate control signal COT0 is selected by an increment of the counter 210. When the output gate control signal COT0 is selected, the read command DRCa or output of the point-shift FIFO circuit 160 becomes active. In this example, the latency is set to an even number, and thus, the read command DRCa passes through the latency adding circuit 150, and is directly outputted as the read command DRCb.

The read command DRCb is in synchronism with the even-numbered internal clock LCLK, and using this read command DRCb, read data DQ is actually outputted.

Thereafter, upon making an entry to the self-refresh mode or the power-down mode, the internal clock LCLK is cut off by the stop circuit 110 shown in FIG. 1. Thereby, the operation of the latency counter 100 is stopped. At this time, a hazard can be outputted to the internal clock LCLK depending on a certain timing, and count value of the counters 210 and 220 may jump.

However, in the latency counter 100, the count value itself does not carry significance, and when the correct increment (or decrement) is performed at the time of a normal operation, no problem is generated. That is, the count value being resulting in an error can be fundamentally eliminated, and even when the count value jumps, a subsequent operation can be continuously executed.

Figure 12:
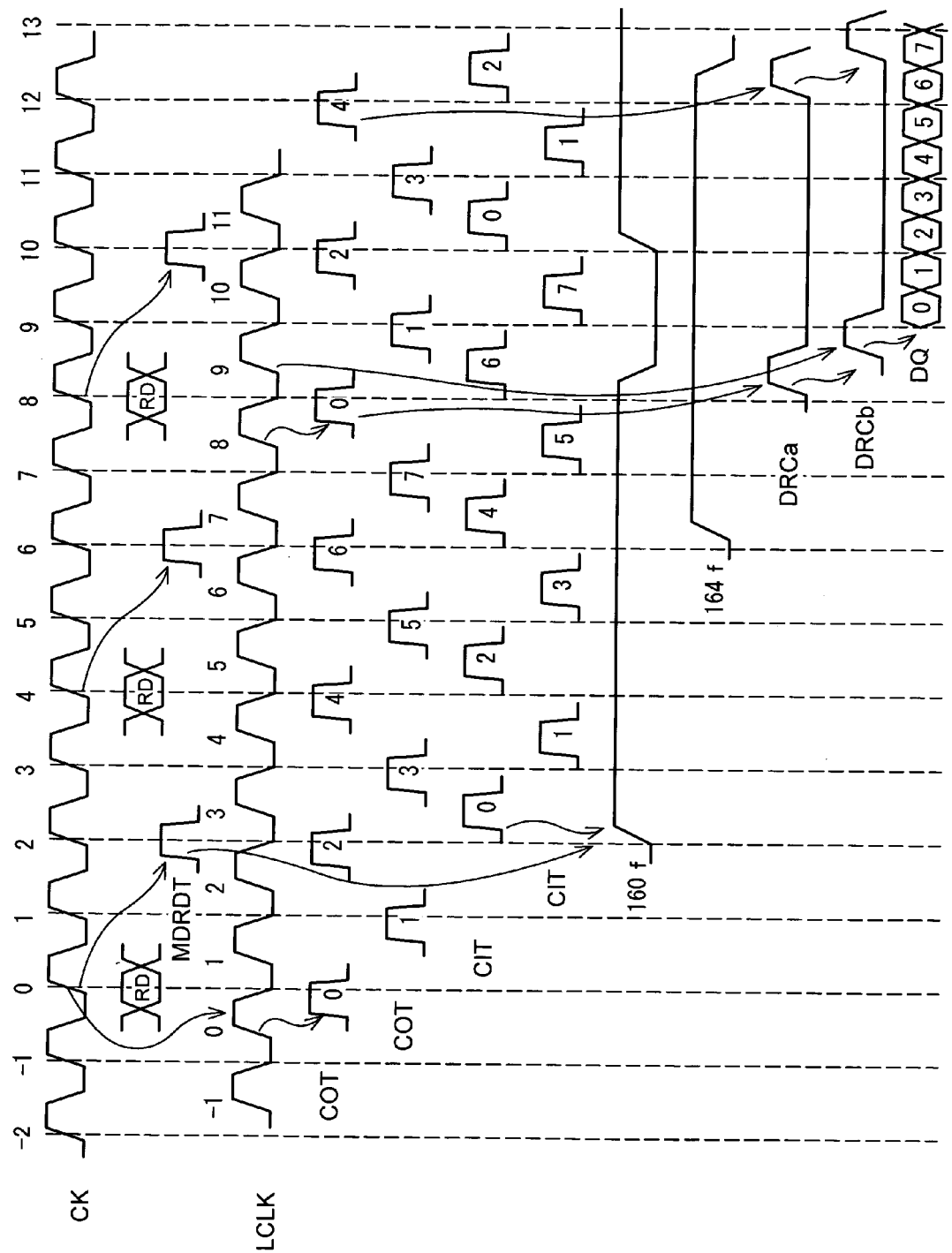
FIG. 12 is another timing chart for explaining the operation of the latency counter, and shows a case that the latency is set to an odd number.

FIG. 12 is another timing chart for explaining the operation of the latency counter 100, and shows a case that the latency is set to an odd number.

When the latency is set to the odd number, the read command DRCa outputted from the frequency-divided counter circuits 130 and 140 is delayed by one clock by the latency adding circuit 150, and outputted as the read command DRCb. Thereby, the read command DRCb is synchronized to the odd-numbered internal clock LCLK, and using the read command DRCb, the read data DQ is actually outputted.

Although not shown, when the value of the latency is set to 1, a frequency-dividing operation by the frequency-dividing circuit 120 is stopped, and the internal clock LCLK is directly supplied to the frequency-divided counter circuit 130. Thereby, the count value within the frequency-divided counter circuit 130 can be set to 0 to 3. As a result, a relationship of latency=1 can be realized.

As explained above, according to the latency counter 100, the count operation is performed in synchronism with the divided clocks LCLKE and LCLKO obtained by frequency-dividing the internal clock LCLK by 2, and thus, even when the frequency of the internal clock LCLK is high, operation margins of the frequency-divided counter circuits 130 and 140 can be sufficiently secured.

The number of bits of the ripple counters 210 and 310 included in the frequency-divided counter circuits 130 and 140 becomes small, and thus, the delay which occurs in the ripple counters become small. As a result, it becomes possible to directly supply the synchronizing circuits 230 and 330 with the divided clocks LCLKE and LCLKO. That is, when the delay of the ripple counters is large, to synchronize correctly, it is necessary that the divided clocks LCLKE and LCLKO are applied a certain amount of delay, and thereafter, inputted to the synchronizing circuits 230 and 330. In this case, there occurs a need of arranging a re-synchronizing circuit that restores the delay to resynchronize the read command to the internal clock LCLK. Such a re-synchronizing circuit can decrease a command transfer margin when the frequency of the clock is high. However, in the present embodiment, such a re-synchronizing circuit is unnecessary, and as a result, even when the frequency of the clock is high, a sufficient transfer margin can be secured.

Further, in the present embodiment, the ripple counters 210 and 310 are used, and thus, as described above, it is possible to prevent an error resulting from the hazard of the internal clock LCLK.

Further, while the latency is counted, the read command MDRDT remains in a state of being held in one of the flip-flops within the point-shift FIFO circuit 160, and thus, a sufficient time for shifting a subject with which the read command is synchronized from the external clock CK to the internal clock LCLK will also be secured.

Most preferably, the latency counter according to the present embodiment is used for a DDR DRAM.

Figure 13:
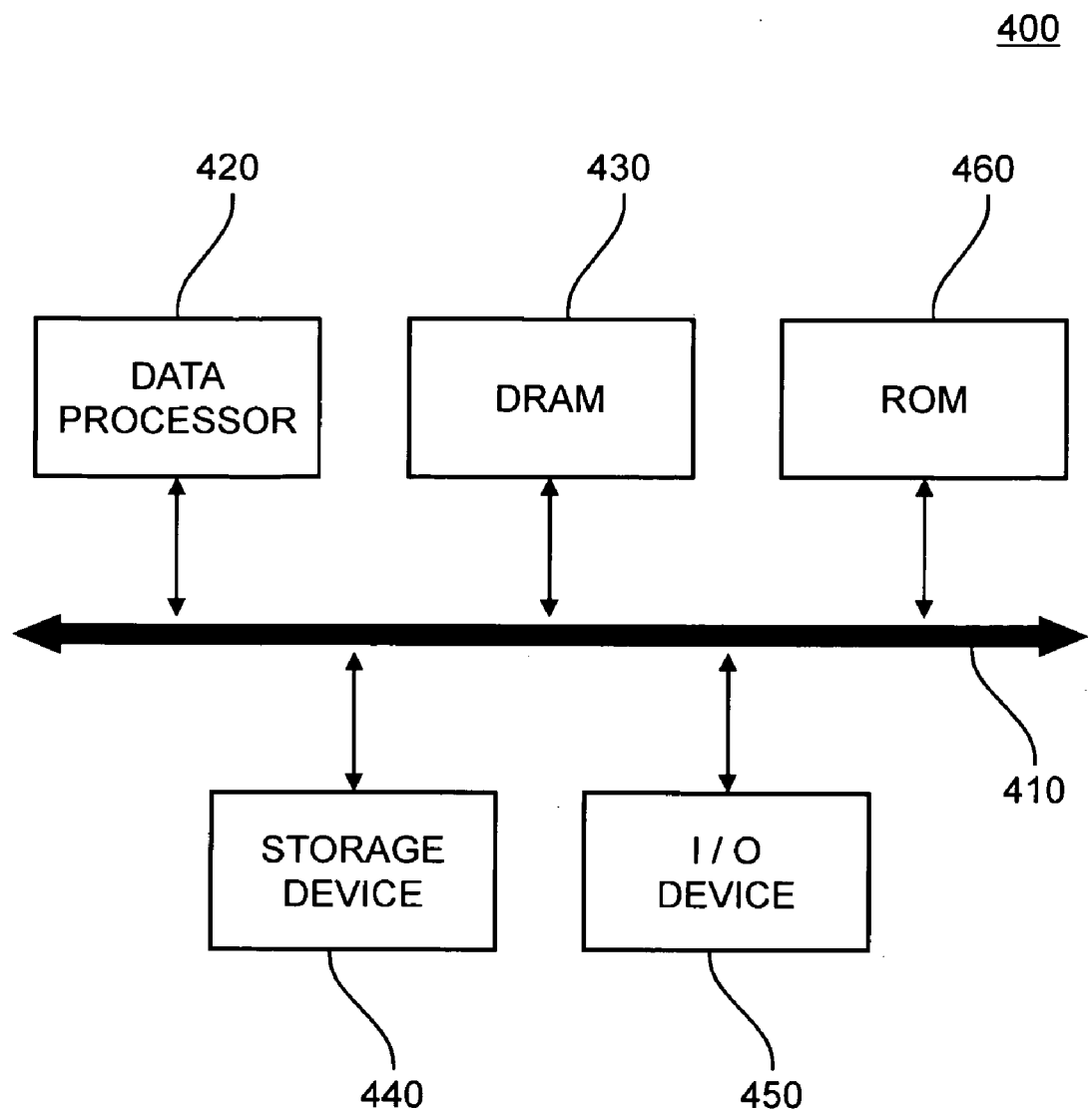
FIG. 13 is a block diagram showing a configuration of the data processing system using a semiconductor memory device according to the embodiment.

FIG. 13 is a block diagram showing a configuration of the data processing system 400 using a semiconductor memory device according to the embodiment, and shows a case that the semiconductor memory device is a DRAM.

The data processing system 400 shown in FIG. 13 has a configuration such that a data processor 420 and a semiconductor memory device (DRAM) 430 are connected to each other via a system bus 410. Examples of the data processor 420 include but are not limited to a microprocessor (MPU) and a digital signal processor (DSP). In FIG. 13, for the sake of simplification, the data processor 420 and the DRAM 430 are connected via the system bus 410. However, instead of being via the system bus 410, these components can be connected by a local bus.

In FIG. 13, for the sake of simplification, only one set of system bus 410 is shown. However, the system bus 410 can be arranged via a connector or the like in series or in parallel, where appropriate. In the memory-system data processing system shown in FIG. 13, a storage device 440, an I/O device 450, and a ROM 460 are connected to the system bus 410. However, these are not necessarily essential constituent components.

Examples of the storage device 440 can include a hard disk drive, an optical disk drive, and a flash memory. Examples of the I/O device 450 can include a display device such as a liquid crystal display, and an input device such as a keyboard and a mouse. Regarding the I/O device 450, even only one of an input device and an output device can suffice. For the sake of simplification, each constituent element shown in FIG. 13 is shown by one. However, the number is not limited to one, and one or more constituent elements can be arranged in plural.

The present invention is in no way limited to the aforementioned embodiments, but rather various modifications are possible within the scope of the invention as recited in the claims, and naturally these modifications are included within the scope of the invention.

For example, in the above embodiment, the frequency-dividing circuit 120 is used to frequency-divide the internal clock LCLK by 2. However, the frequency-dividing number is not limited thereto in the present invention. Accordingly, when the internal clock LCLK is higher in speed, the internal clock LCLK can be frequency-divided by 4 and four frequency-divided counter circuits can be arranged.

Furthermore, in the above embodiment, the latency adding circuit 150 that adds the latency by one clock is used. However, in the present invention, the arrangement of the latency adding circuit is not essential. When setting of the odd-numbered latency is practically unnecessary, the circuit can be omitted.

Further, in the above embodiment, a case that the latency is set to 1 is assumed and a function for stopping the frequency-dividing operation is provided. However, practically, setting of such a latency is unnecessary, the function can be omitted.

While the ripple counters are used for the counters 210 and 310 in the above embodiment, the present invention is not limited thereto.

What is claimed is:

1. A semiconductor memory device comprising:
   a latency counter that counts a latency of an internal command in synchronism with an internal clock, the latency counter comprising:
   a frequency-dividing circuit that generates a plurality of divided clocks of which phases differ each other based on the internal clock; and
   a plurality of frequency-divided counter circuits each of which counts the latency of the internal command based on the corresponding divided clock.

2. The semiconductor memory device as claimed in claim 1, wherein the latency counter further comprises a latency adding circuit for adding the latency of the internal command at least by one clock cycle of the internal clock.

3. The semiconductor memory device as claimed in claim 1, wherein the frequency-dividing circuit supplies a same clock as the internal clock in response to a predetermined control signal.

4. The semiconductor memory device as claimed in claim 1, wherein the frequency-divided counter circuits include:

a point-shift FIFO (first-in first-out) circuit in which a plurality of latch circuits each having input gates and output gates are connected in parallel and in which the internal command is commonly supplied to the input gates; and a selector that selects any one of the input gates and any one of the output gates.

5. The semiconductor memory device as claimed in claim 4, wherein
the selector includes a counter for selecting the input gates and the output gates based on a count value thereof, and
the counter outputs the count value in a binary format in synchronism with the internal clock.

6. The semiconductor memory device as claimed in claim 5, wherein the counter includes a timing circuit that allows change timings of a plurality of bits configuring the count value to coincide.

7. The semiconductor memory device as claimed in claim 6, wherein the counter comprises a ripple counter, and the timing circuit comprises a delay circuit.

8. The semiconductor memory device as claimed in claim 5, wherein the selector further includes a decoder that decodes the count value in a binary format, and one of the input gates and the output gates is selected based on an output value of the decoder.

9. The semiconductor memory device as claimed in claim 8, wherein the selector further includes a shift circuit for selecting an alternate one of the input gates and the output gates based on a correspondence relationship between the input gates and the output gates previously determined.

10. The semiconductor memory device as claimed in claim 9, wherein the shift circuit can change the correspondence relationship between the input gates and the output gates based on a setting signal.

11. A data processing system comprising:
a data processor and a semiconductor memory device coupled to the data processor,
wherein the semiconductor memory device includes a latency counter that counts a latency of an internal command in synchronism with an internal clock, the latency counter comprising:
a frequency-dividing circuit that generates a plurality of divided clocks of which phases differ each other based on the internal clock; and
a plurality of frequency-divided counter circuits each of which counts the latency of the internal command based on the corresponding divided clock.

12. The data processing system as claimed in claim 11, wherein the latency counter further comprises a latency adding circuit for adding the latency of the internal command at least by one clock cycle of the internal clock.

13. The data processing system as claimed in claim 11, wherein the frequency-dividing circuit supplies a same clock as the internal clock in response to a predetermined control signal.

14. The data processing system as claimed in claim 11, wherein the frequency-divided counter circuits include:
a point-shift FIFO (first-in first-out) circuit in which a plurality of latch circuits each having input gates and output gates are connected in parallel and in which the internal command is commonly supplied to the input gates; and
a selector that selects any one of the input gates and any one of the output gates.

15. The data processing system as claimed in claim 14, wherein
the selector includes a counter for selecting the input gates and the output gates based on a count value thereof, and
the counter outputs the count value in a binary format in synchronism with the internal clock.

16. The data processing system as claimed in claim 15, wherein the counter includes a timing circuit that allows change timings of a plurality of bits configuring the count value to coincide.

17. The data processing system as claimed in claim 16, wherein the counter comprises a ripple counter, and the timing circuit comprises a delay circuit.

18. The data processing system as claimed in claim 15, wherein the selector further includes a decoder that decodes the count value in a binary format, and one of the input gates and the output gates is selected based on an output value of the decoder.

19. The data processing system as claimed in claim 18, wherein the selector further includes a shift circuit for selecting an alternate one of the input gates and the output gates based on a correspondence relationship between the input gates and the output gates previously determined.

20. The data processing system as claimed in claim 19, wherein the shift circuit can change the correspondence relationship between the input gates and the output gates based on a setting signal.

21. A latency counter that counts latencies of an internal command synchronously with an internal clock, the latency counter comprising:
an input node supplied with command information;
an output node;
a plurality of latch circuits each having input and output ends;
a first selector having a first node coupled to the input node and a plurality of second nodes coupled respectively to the input ends of the latch circuits, and forming an electrical path between the first node and a selected one of the second nodes in response to input selection information;
a second selector having a third node coupled to the output node and a plurality of fourth nodes coupled respectively to the output ends of the latch circuits and forming an electrical path between the third node and a selected one of the fourth nodes in response to output selection information;
a counter circuit counting a clock signal and producing one of the input and output selection information; and
a shift circuit receiving and shifting the one of the input and output selection information to produce the other of the input and output selection information.

22. The latency counter of claim 21, wherein the shift circuit responds to latency information and determines a shifting amount to provide a difference between the input and output selection information.

23. The latency counter of claim 22, wherein the counter circuit includes a counter supplied with the clock signal, a decoder circuit decoding a count value of the counter, and a synchronizing circuit supplied with a decoded output of the decoder circuit to produce the one of the input and output selection information in response to a signal that is obtained by delaying the clock signal.

* * * * *